(12) United States Patent
Yoshida

(10) Patent No.: US 11,001,924 B2
(45) Date of Patent: May 11, 2021

(54) SUBSTRATE PROCESSING APPARATUS, NOZZLE BASE, AND MANUFACTURING METHOD FOR SEMICONDUCTOR DEVICE

(71) Applicant: HITACHI KOKUSAI ELECTRIC INC., Tokyo (JP)

(72) Inventor: Hidenari Yoshida, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 297 days.

(21) Appl. No.: 15/692,187

(22) Filed: Aug. 31, 2017

(65) Prior Publication Data

US 2018/0087152 A1 Mar. 29, 2018

(30) Foreign Application Priority Data

Sep. 28, 2016 (JP) .............................. JP2016-189639

(51) Int. Cl.
*C23C 16/455* (2006.01)
*H01L 21/205* (2006.01)
*H01L 21/31* (2006.01)
*C23C 16/40* (2006.01)
*C23C 16/458* (2006.01)

(52) U.S. Cl.
CPC .......... *C23C 16/455* (2013.01); *C23C 16/402* (2013.01); *C23C 16/4584* (2013.01); *C23C 16/45578* (2013.01); *C23C 16/45587* (2013.01); *H01L 21/205* (2013.01); *H01L 21/31* (2013.01)

(58) Field of Classification Search
CPC ............ C23C 16/455; C23C 16/45578; H01L 21/205; H01L 21/31

USPC ......................................................... 118/715
See application file for complete search history.

(56) References Cited

U.S. PATENT DOCUMENTS

| | | | | |
|---|---|---|---|---|
| 2003/0224615 A1* | 12/2003 | Nishino | ................... | C23C 16/54 438/758 |
| 2009/0205783 A1* | 8/2009 | Tanabe | ..................... | C30B 25/14 156/345.37 |
| 2010/0212593 A1* | 8/2010 | Takebayashi | ....... | C23C 16/4402 118/725 |
| 2010/0282166 A1* | 11/2010 | Fukuda | ................. | C23C 16/347 118/722 |

FOREIGN PATENT DOCUMENTS

| | | |
|---|---|---|
| JP | 2012-069845 A | 4/2012 |
| JP | 2015-151574 A | 8/2015 |
| JP | 2015-185578 A | 10/2015 |
| JP | 2016-122691 A | 7/2016 |

* cited by examiner

*Primary Examiner* — Elizabeth A Burkhart
(74) *Attorney, Agent, or Firm* — Volpe Koenig

(57) ABSTRACT

Provided is a processing container formed of a reaction tube and a manifold that supports the reaction tube from below, and adapted to process a substrate inside, a nozzle adapted to supply a processing gas to the substrate, and a connecting portion adapted to erect the nozzle inside the processing container. The connecting portion includes (1) a fixing portion formed of a cylindrical portion inserted into an introduction portion provided at the manifold, and a flange plate formed at an end portion of the cylindrical portion, and (2) a detachable portion formed of an elbow engaged with the flange plate, and an installation portion in which the nozzle is installed.

11 Claims, 5 Drawing Sheets

SUBSTRATE PROCESSING APPARATUS, NOZZLE BASE, AND MANUFACTURING METHOD FOR SEMICONDUCTOR DEVICE

BACKGROUND

Technical Field

The present invention relates to a substrate processing apparatus, a nozzle base, and a manufacturing method for a semiconductor device.

Related Art

In substrate processing in a manufacturing process for semiconductor devices (such as integrated circuits), for example, a vertical substrate processing apparatus that collectively processes a plurality of substrates is used. In the vertical substrate processing apparatus, a nozzle to supply a processing gas is installed inside a reaction tube by being connected and fixed to a gas introduction port provided at an inlet. In many cases, nozzle maintenance is carried out by accessing from an opening of the reaction tube, and it may take time to perform the maintenance work. Therefore, a structure of basal portion of the nozzle is devised such that the nozzle can be removed from the reaction tube to enable maintenance to be performed from inside of the reaction tube (JP 2015-185578A).

SUMMARY

However, in the case of devising a structure of a nozzle base, a cost for production may be expensive and an unstable state may arise at the time of nozzle installation. The present disclosure is made in view of the above-described circumstances, and directed to providing a technique that can improve maintainability during a nozzle attachment and detachment.

According to an embodiment of the present disclosure, provided is a substrate processing apparatus including:

a processing container including a reaction tube and a manifold that supports the reaction tube from below, and adapted to process a substrate inside:

a nozzle adapted to supply a processing gas to the substrate; and a connecting portion adapted to connect the nozzle inside the processing container, wherein the connecting portion includes:

a fixing portion including a cylindrical portion inserted into an introduction portion provided at the manifold, and a flange plate formed at an end portion of the cylindrical portion; and a detachable portion including an elbow engaged with the flange plate, and an installation portion in which the nozzle is installed, and the detachable portion being attached to the fixing portion, and a cut-out portion is formed in the elbow, and the flange plate contacts the cut-out portion.

According to the present disclosure, maintainability at the time of nozzle attachment and detachment can be improved.

BRIEF DESCRIPTION OF THE DRAWINGS

FIG. 7 is a back view of the detachable portion preferably used in the embodiment of.

DETAILED DESCRIPTION

In the following, an exemplary embodiment of the present invention, not intended to be limited, will be described below with reference to the drawings. In all the drawings, note that a same or corresponding component is denoted by the same or corresponding reference sign, and redundant description will be omitted. Note that a direction toward a center of a processing container is defined as a front side (front surface side), and a direction toward outside from the center of the processing container is defined as a back side (back surface side). Additionally, note that a direction toward an upper portion of the processing container is defined as an upper side and a direction toward a lower portion of the processing container is defined as a lower side.

Figure 1:
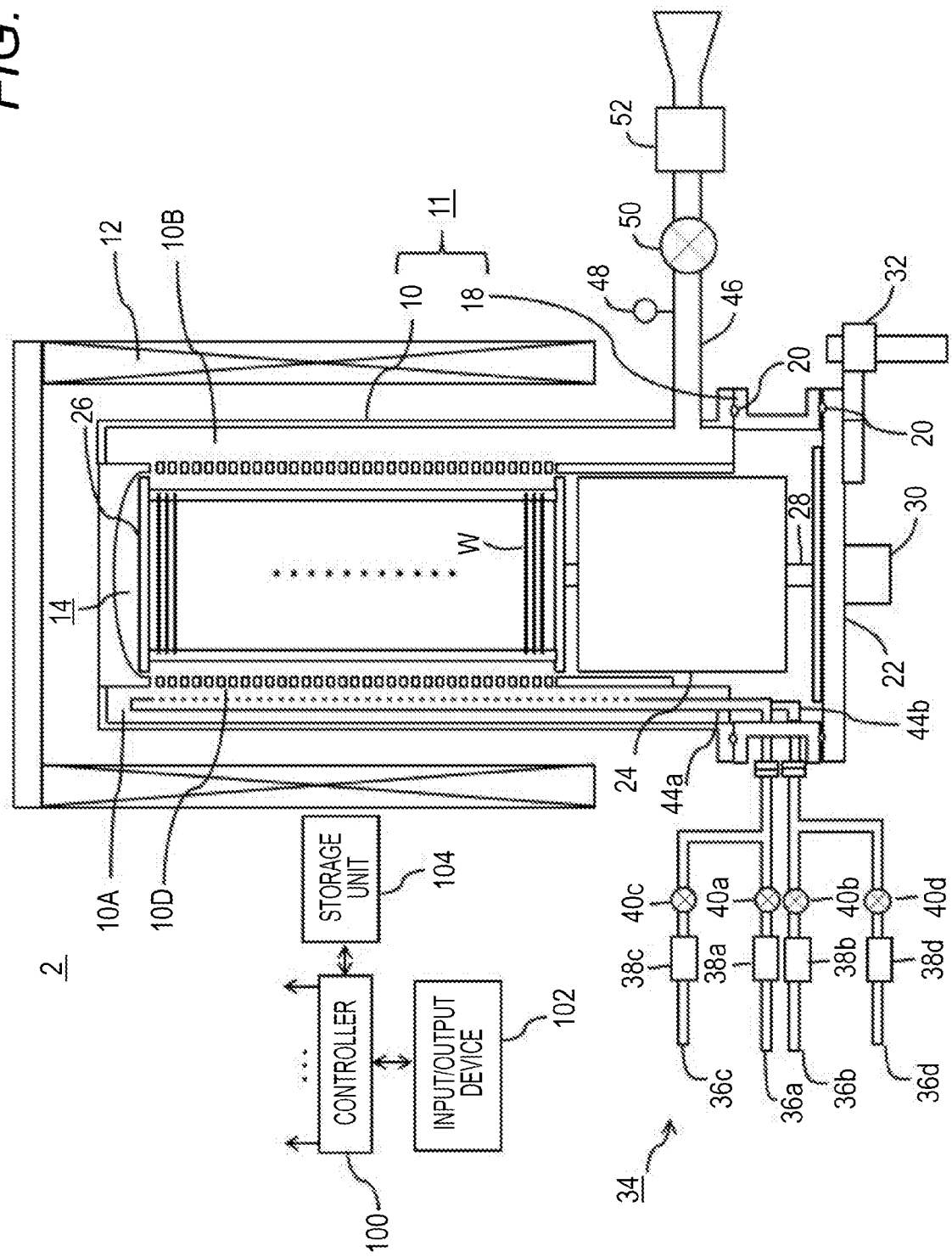
FIG. 1 is a vertical cross-sectional view schematically illustrating an exemplary substrate processing apparatus preferably used in an embodiment.

In the present embodiment, a substrate processing apparatus is formed as a vertical substrate processing apparatus (hereinafter referred to as processing apparatus) 2 adapted to execute a substrate processing process such as heat treatment as one process of manufacturing processes in a manufacturing method for a semiconductor device (device). As illustrated in FIG. 1, the processing apparatus 2 includes a cylindrical reaction tube 10 and a heater 12 serving as a heating unit (heating mechanism) installed in an outer periphery of the reaction tube 10. The reaction tube is made of quartz or SiC, for example.

As illustrated in FIG. 1, a supply buffer chamber 10A and an exhaust buffer chamber 10B fare formed facing each other in the reaction tube 10 in a manner protruding outward from the cylindrical portion. The supply buffer chamber 10A has the inside partitioned into a plurality of spaces (nozzle chambers) by a partition wall 10C. In each of the spaces in the supply buffer chamber 10A, nozzles 44a and 44b described later are respectively installed. A plurality of slits 10D is formed in multiple stages in a vertical direction on an inner wall between the supply buffer chamber 10A and a process chamber 14 in a manner corresponding to the plurality of spaces. In the reaction tube 10, a temperature detection unit serving as a temperature detector is installed along an outer wall of the reaction tube 10.

A cylindrical manifold 18 serving as a support portion to support the reaction tube 10 is joined to a lower end opening portion of the reaction tube 10 via a sealing member (hermetic member) 20 such as an O ring, and supports a lower end of the reaction tube 10. The manifold 18 has an inner diameter formed substantially same as an outer diameter of the supply buffer chamber 10A, and is formed of metal such as stainless steel, for example. In the manifold 18, gas inlet ports 56a and 56b (hereinafter referred to as "ports") are formed as gas introduction portions respectively connected to gas supply pipes 36a and 30b described later. A processing container 11 is formed of the reaction tube 10 and the manifold 18, and a process chamber 14 to process a wafer W serving as a substrate is formed inside the processing container 11.

A lower end opening portion of the manifold 18 is opened and closed by a disc-shaped lid portion 22. The lid portion 22 is formed of metal, for example. A sealing member 20 such as an O-ring is installed on an upper surface of the lid portion 22, thereby hermetically seal the inside of the processing container 11 from outside air. A heat insulation unit 24 is placed on the lid portion 22.

The process chamber 14 houses a boat 26 adapted to vertically support a plurality of wafers W and serving as a substrate holder, for example, 25 to 150 wafers W in a shelf shape. The boat 26 is supported above the heat insulation unit 24 by a rotating shaft 28 that penetrates the lid portion 22 and a hole of the heat insulation unit 24. The rotating shaft 28 is formed rotatable while keeping a state of hermetically sealing the inside of the reaction tube 10. The lid portion 22 is driven in a vertical direction by a boat elevator 32 serving as an elevating mechanism. Consequently, the boat 26 and the lid portion 22 are integrally moved up and down, and the boat 26 is loaded to and unloaded from the reaction tube 10.

The processing apparatus 2 includes a gas supply mechanism 34 that supplies the process chamber 14 with a gas used for substrate processing. The gas supplied by the gas supply mechanism 34 is changed in accordance with a kind of a film to be formed. Here, the gas supply mechanism 34 includes a raw material gas supply unit, a reaction gas supply unit, and an inert gas supply unit.

The reaction gas supply unit has a gas supply pipe 36a, and the gas supply pipe 36a is provided with, sequentially from an upstream side, a mass flow controller (MFC) 38a that is a flow rate controller (flow rate control unit) and a valve 40a that is an on-off valve. The gas supply pipe 36a is connected to the nozzle 44a via the port 56a and a connecting portion 60a described later. The nozzle 44a is erected in the vertical direction in a nozzle chamber inside the supply buffer chamber 10A up to a height position of an uppermost wafer W on the boat 26. A plurality of gas ejection holes (supply holes) opened to the wafer W held by the boat 26 is formed at the nozzle 44a. The reaction gas is diffused into the supply buffer chamber 10A via the supply holes of the nozzle 44a, and the reaction gas is supplied to the wafer W via the slits 10D of the supply buffer chamber 10A.

In the following, the raw material gas supply unit is provided with a supply pipe 36b, an MFC 38b, a valve 40b, and the nozzle 44b in a similar structure. The inert gas supply section is provided with supply pipes 36c and 36d, MFCs 38c and 38d, valves 40c and 40d, the nozzles 44a and 44b, and the slits 10D.

An exhaust pipe 46 is attached to the reaction tube 10 so as to communicate with the exhaust buffer chamber 10B. The exhaust pipe 46 is connected to a vacuum pump 52 serving as a vacuum evacuation device via a pressure sensor 48 serving as a pressure detector (pressure detecting unit) to detect a pressure inside the process chamber 14 and via an auto pressure controller (APC) valve 50 serving as a pressure regulator (pressure adjuster). With this structure, the pressure inside the process chamber 14 can be set to a processing pressure in accordance with processing.

Figure 2:
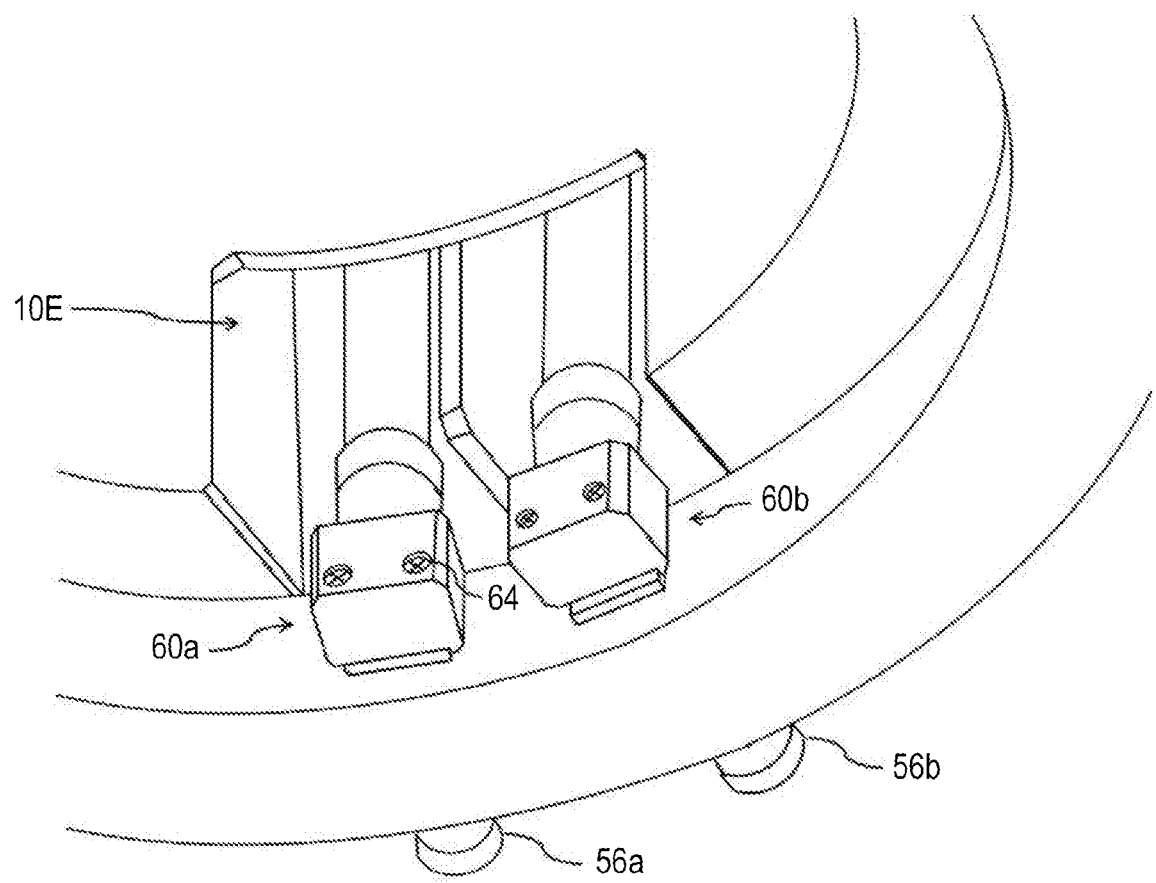
FIG. 2 is a perspective view schematically illustrating an exemplary lower portion of a processing container preferably used in the embodiment.

As illustrated in FIG. 2, an opening portion 10E is formed at a lower end of an inner wall of the reaction tube 10 on the supply buffer chamber 10A side. During maintenance, the nozzle can be detached from the inside of the reaction tube 10 (process chamber 14 side) and can be attached again via the opening portion 10E. The opening portion 10E of the present example is opened large enough such that the nozzle 44a can be touched with a hand or a special jig.

Figure 3:
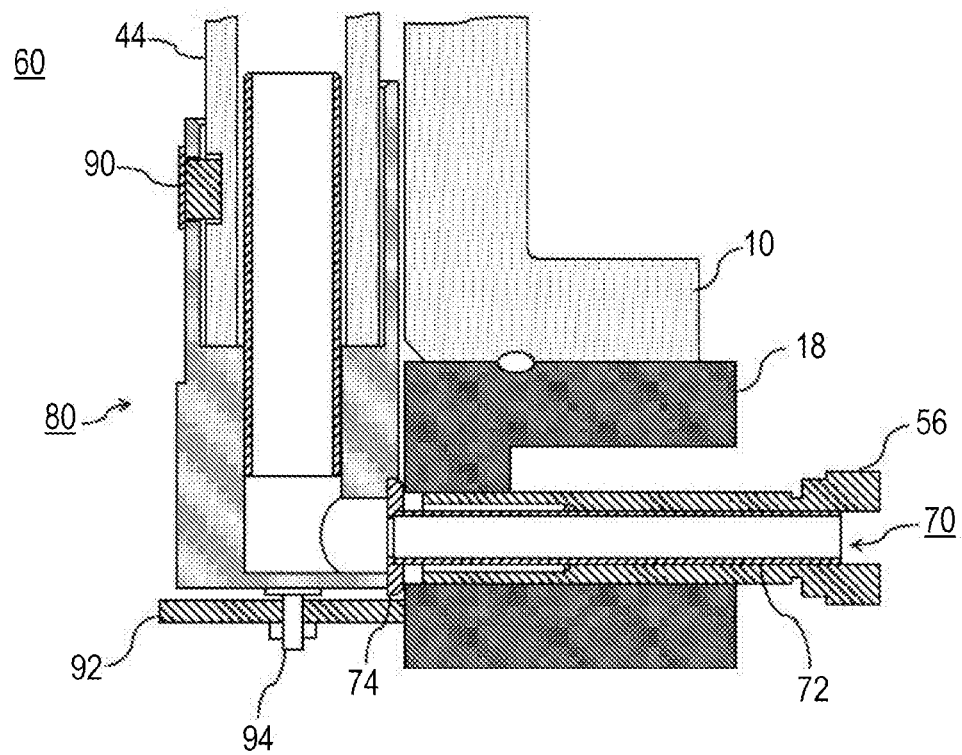
FIG. 3 is a vertical cross-sectional view of a lower portion of the lower portion of the processing container preferably used in the embodiment.

As illustrated in FIGS. 2 and 3, the ports 56a and 56b serving as gas introduction portions are provided in the manifold 18 located below the opening portion 10E in a manner corresponding to each of the nozzle chambers. In the following, when a nozzle 44 is referred, at least one of the nozzles 44a and 44b is indicated. As for a gas supply pipe 36, a port 56, and a connecting portion 60, the same is applied. As illustrated in FIG. 3, the port 56 is adapted to provide communication between inside and outside of the manifold 18, and welded to the manifold 18, extends in a radial direction, and has a tip thereof provided with a union joint. The nozzle 44 is inserted into each nozzle chamber from the opening portion 10E, and is fixed to the manifold 18 by the connecting portion 60 serving as a nozzle base. Since the nozzle 44 is surrounded by the nozzle chamber, a range in which the nozzle can be horizontally moved is little. The structure of the connecting portion 60 will be described later. A bracket 92 is provided below the port 56. The bracket 92 is not illustrated in FIG. 2.

As illustrated in FIG. 1, a controller 100 is connected to a rotating mechanism 30, the boat elevator 32, the MFCs 38a to 38d of the gas supply mechanism 34, the valves 40a to 40d, and the APC valve 50. The controller 100 is formed of, for example, a microprocessor (computer) including a CPU, and adapted to control operation of the processing apparatus 2. An input/output device 102 formed as, for example, a touch panel or the like is connected to the controller 100.

A storage unit 104 serving as a storage medium is connected to the controller 100. The storage unit 104 stores, in a readable manner, a control program to control operation of the processing apparatus 2 and a program (also referred to as a recipe) to cause each of components of the processing apparatus 2 to execute processing in accordance with processing conditions.

The storage unit 104 may be a storage device (a hard disk or a flash memory) incorporated inside the controller 100, or may be a portable external recording device (a magnetic tape, a magnetic disk such as a flexible disk or a hard disk, an optical disk such as a CD or a DVD, a magneto-optical disk such as an MO, or a semiconductor memory such as a USB memory or a memory card). Also, a program may be provided in the computer by using a communication unit such as the Internet or a dedicated line. The program is read out from the storage unit 104 in accordance with a command from the input/output device 102 or the like as necessary, and the controller 100 executes processing in accordance with the read recipe, thereby causing the processing apparatus 2 to execute desired processing under the control of the controller 100.

Next, a structure of the connecting portion 60 will be described.

As illustrated in FIG. 3, the connecting portion 60 is formed of: a fixing portion 70 inserted into the port 56; and a detachable portion 80 attached to the fixing portion 70.

Figure 4:
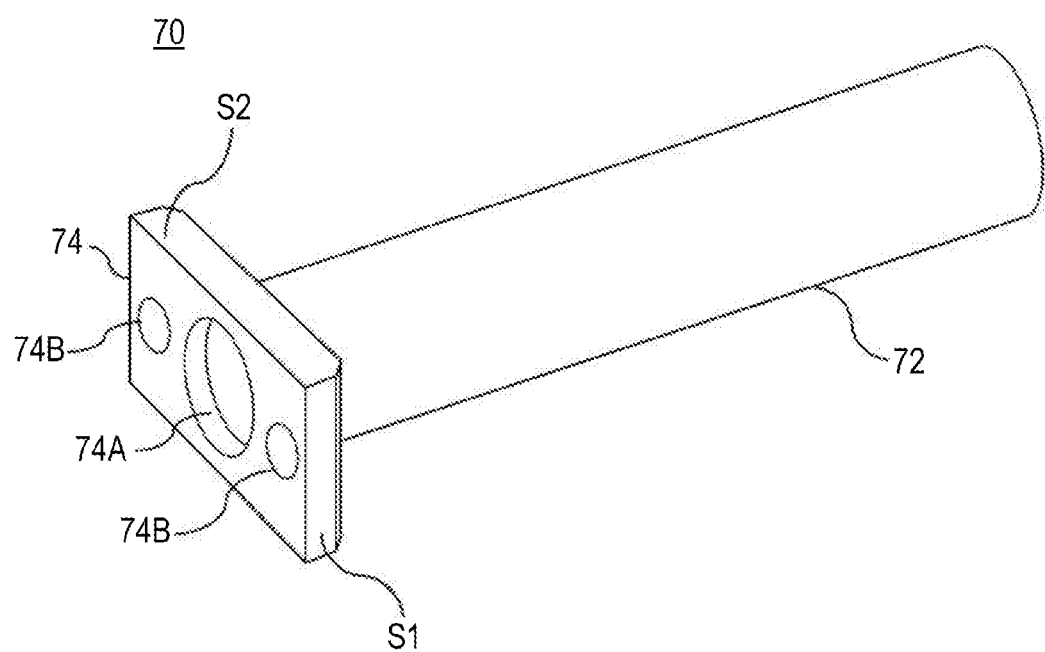
FIG. 4 is a perspective view of a fixing portion preferably used in the embodiment.

As illustrated in FIG. 4, the fixing portion 70 is formed of a metal cylindrical portion 72 and a flange plate 74. The cylindrical portion 72 is formed in a linear cylindrical shape and is inserted and fixed to the port 56. The cylindrical portion 72 has an outer diameter equal to or less than a diameter of the port 56 and is formed to have a size substantially same as an outer diameter of the gas supply pipe 36. Additionally, the cylindrical portion 72 has an inner diameter substantially same as an inner diameter of the gas supply pipe 36. The flange plate 74 is formed in a polygonal plate shape at an end portion of the cylindrical portion 72. Here, the flange plate 74 is formed in a rectangular shape, and includes first surfaces S1 that are upper and lower end surfaces and second surfaces S2 located on both sides perpendicular to the first surfaces S1. The flange plate 74 has an area larger than a cross-sectional area of the outer diameter of the cylindrical portion 72. As illustrated in FIG. 4, the fixing portion 70 is inserted from inside of the port 56 in a manner such that the flange plate 74 is positioned inside the processing container 11, and preferably, such that the flange plate 74 contacts an inner wall surface of the manifold 18. The cylindrical portion 72 inserted into the port 56 is fixed to a degree in which an end portion thereof is tightened by the union joint of the port 56 and is not easily rotated. At this point, a hermetic member of the joint seals a gap between the cylindrical portion 72 and the gas supply pipe 36.

Figure 5:
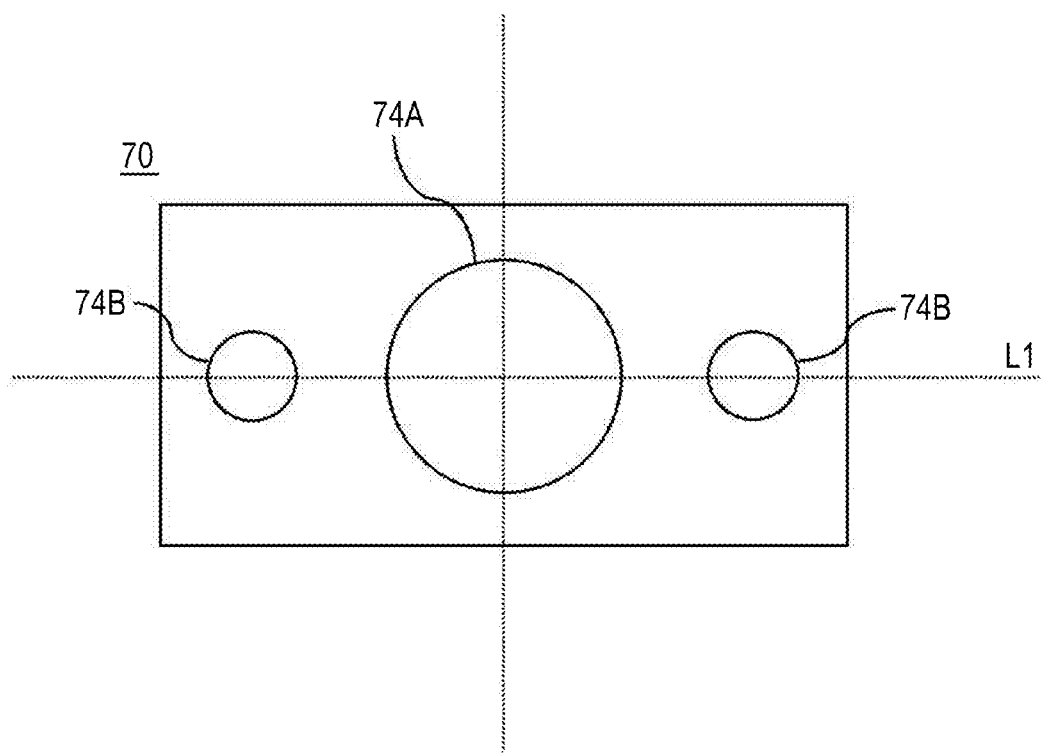
FIG. 5 is a front view of the fixing portion preferably used in the embodiment.

As illustrated in FIG. 5, a communication hole 74A communicating with a hollow portion of the cylindrical portion 72 is formed substantially at a center of the flange plate 74. The communication hole 74A is formed in a manner such that a center of the cylindrical portion 72 and a center of the communication hole 74A are located on the same straight line. As illustrated in FIG. 3, the communication hole 74A has a diameter substantially equal to the outer diameter of the cylindrical portion 72 on the port 56 side and substantially equal to the inner diameter of the cylindrical portion 72 on the detachable portion 80 side. Additionally, the cylindrical portion 72 is hermetically welded in a state of being inserted into the communication hole 74A.

As illustrated in FIGS. 3 and 4, corners of the flange plate 74 are obliquely removed and chamfered. Furthermore, in the flange plate 74, corner portions of a surface (surface on the back surface side) contacting the manifold 18 are chamfered deeper than a surface not contacting the manifold 18, namely, corner portions of a surface (surface on the front surface side) contacting the detachable portion 80. With this structure, the manifold 18 and flange plate 74, and flange plate 74, and the detachable portion 80 can be fixed with high accuracy.

One hole 74B serving as a screw hole is formed on each of right and left sides on both sides of the communication hole 74A. The hole 74B is a threaded hole and has a center aligned with a center of the communication hole 74A on the same straight line L1, and also the holes 74B are formed at a bilaterally symmetrical positions by setting the center of the communication hole 74A as a boundary. With this structure, load bias relative to the flange plate 74 can be suppressed at the time of installing the detachable portion 80, the fixing portion 70 is hardly damaged, and the nozzle 44 can be stably installed.

Figure 6:
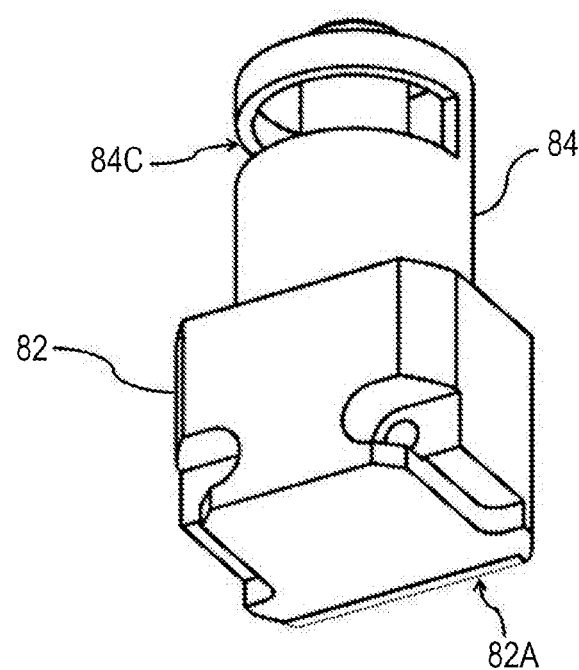
FIG. 6 is a perspective view of a detachable portion preferably used in the embodiment.

As illustrated in FIG. 6, the detachable portion 80 is formed of an elbow 82 and an installation portion (nozzle mount) 84. The elbow 82 has a polygonal block shape and is formed to be engaged with the fixing portion 70 on the back surface side (the manifold 18 side). The installation portion 84 has a cylindrical shape, is formed in a manner erected from an upper surface of the elbow 82, and has the nozzle 44 installed therein. Note that the elbow 82 and the installation portion 84 are integrally formed.

Figure 7:
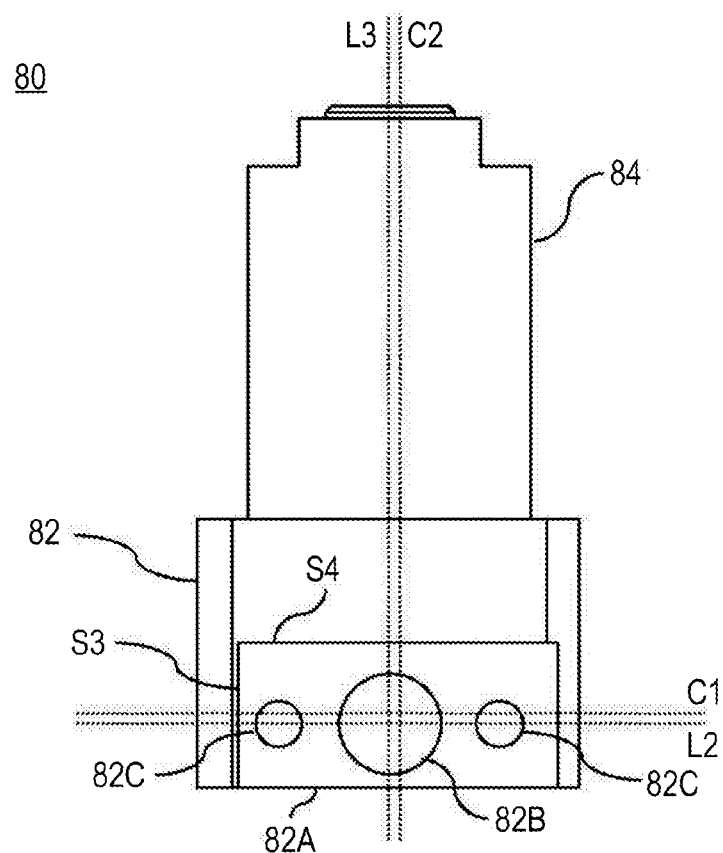
Figure 8:
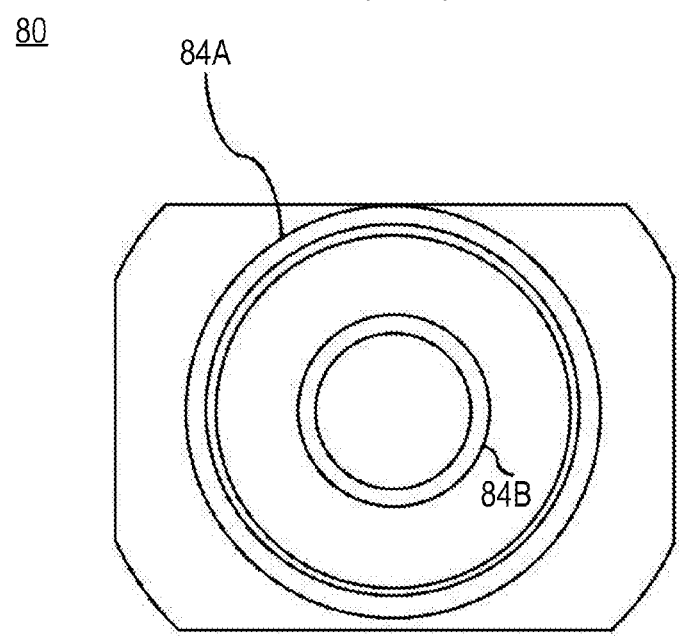
FIG. 8 is a top view of the detachable portion preferably used in the embodiment.

As illustrated in FIG. 8, the installation portion 84 has a double pipe structure including an outer pipe 84A and an inner pipe 84B, and the nozzle 44 is inserted and fixed in an annular space located between the outer pipe 84A and the inner pipe 84B. As illustrated in FIG. 7, an upper end of the outer pipe 84A is formed such that a portion on the back surface side is one-stage higher, and the upper end of the outer pipe 84A and an upper end of the inner pipe 84B are formed to have substantially the same height. Furthermore, as illustrated in FIGS. 3 and 6, a window portion 84C to install a pin 90 that fixes the nozzle 44 to the installation portion 84 is formed at an upper portion of the outer pipe 84A on the front surface side (process chamber 14 side). The inner pipe 84B is connected to a hollow portion of the elbow 82 described later.

As illustrated in FIG. 3, a hollow space is formed inside the elbow 82 such that the upper surface of the elbow 82 communicates with an opening on the back surface thereof. As illustrated in FIG. 8, a corner portion of the elbow 82 is chamfered in an R-shape (curved surface) and has a rounded shape. In the R-shape chamfering, the corner portion of the elbow 82 is processed in a circular shape so as to be concentric with the inner pipe in the top view. As illustrated in FIG. 6, a lower surface of the elbow 82 has a shape in which right and left portions are partially cut out, and corners on the front side of the lower end is chamfered. Since the right and left portions of the lower surface of the elbow 82 are partially cut out, a fixing member of a cover is prevented from interfering with the elbow 82 at the time of installing the cover in the opening portion 10E.

A cut-out portion 82A recessed in a shape corresponding to the flange plate 74 is formed on the back surface (surface facing the fixing portion 70) of the elbow 82, and the flange plate 74 is formed to be engaged with the cut-out portion 82A. A communication hole 82B having a shape same as that of the communication hole 74A of the flange plate 74 and a hole 82C located at a position same as that of the hole 74B are formed in the cut-out portion 82A. The hole 82C is formed in a manner penetrating from the front surface side to the back surface side of the elbow 82. As illustrated in FIG. 2, since a bolt 64 serving as a fixing member is inserted through the hole 82C of the elbow 82 and screwed into the hole 74B of the flange plate 74 portion, the fixing portion 70 and the detachable portion 80 are fixed.

As illustrated in FIG. 7, the cut-out portion 82A has a rectangular shape, and is formed such that one lateral side and a lower side are opened. In other words, the cut-out portion 82A is structured to form a vertical first surface S3 (parallel to the back surface of the elbow 82) and a horizontal second surface S4 perpendicularly intersects the first surface. Specifically, in the back surface view, the cut-out portion 82A is formed to have only two flat surfaces such that a portion other than the cut-out portion 82A is formed in an L shape. The hole 82C is formed such that a center thereof is located on a straight line L2 passing through the center of the communication hole 82B, and the straight line L2 is formed in a manner passing under a center line C1 of a short side of the cut-out portion 82A. Furthermore, a length of the short side of the cut-out portion 82A is formed shorter than a length of a short side of the flange plate 74. With this structure, a buffer space to adjust (horizontal) inclination of the nozzle 44 can be provided below the detachable portion 80. Additionally, since the flange plate 74 extends downward from the cut-out portion 82A at the time of attaching the detachable portion 80 to the fixing portion 70, an unstable state in longitudinal and lateral directions can be suppressed.

The communication hole 82B of the cut-out portion 82A is formed in a manner such that a center thereof is located on a straight line L3 passing through a center of the elbow 82 (inner pipe 84B). The cut-out portion 82A has a long-side length longer than a long-side length of the flange plate 74, and the long-side length of the cut-out portion 82A is formed bilaterally asymmetric relative to the straight line L3. More specifically, a length on a right side of FIG. 7 (direction opposite to the first surface S3 from the straight line L3) is formed longer than a length on a left side in the same drawing direction to the first surface S3 from the straight line L3). In other words, the straight line L3 is formed in a manner passing through a position more left than a center line C2 of the long side of the cut-out portion 82A. With this structure, since the cut-out portion 82A extends more in one lateral direction than the flange plate 74 at the time of attaching the detachable portion 80 to fixing portion 70, an unstable state in the horizontal direction can be suppressed.

As illustrated in FIG. 3, the cut-out portion 82A is formed to have a depth (width of the first surface S3 and that of the second surface S4) narrower than a width of the flange plate 74 (width of the first surface S1 and that of the second surface S2). With this structure, when the detachable portion 80 is attached to fixing portion 70, a predetermined interval can be formed between reaction tube 10 and the nozzle, and damage of the nozzle caused by contact can be suppressed.

At least the surfaces of the detachable portion 80 and the flange plate 74 are electropolished and smoothly formed so as to have flat surfaces. With this structure, a contacting portion can be sealed without using a hermetic member such as an O-ring because the contact surface between the elbow 82 and the flange plate 74 is tightly joined. In other words, leakage is normally negligible because the gas supply mechanism communicates with the reaction tube through the nozzle at the tip, and no large pressure difference is generated between respective reaction. However, in the case of desiring to improve a sealing property, a hermetic member such as an O ring may also be used in combination.

The bracket 92 serving as a pedestal portion is installed at a lower portion of the elbow 82. The bracket 92 is made of metal same as the manifold 18 and can be screwed to the manifold 18 at a position where a lower end of the flange plate 74 contacts, for example. Since an adjuster 94 such as a hexagonal screw is provided in the bracket 92 in a projecting manner and the adjuster 94 is inserted through from a lower side of the bracket 92, the adjuster 94 can be made to contact a lower surface of the detachable portion 80 and push up the detachable portion 80. One adjuster 94 can correct inclination of the nozzle 44 in the longitudinal direction (radial direction of the reaction tube 10), and a pair of adjusters 94 can further correct inclination in the lateral direction (circumferential direction of the reaction tube 10).

Next, a method of attaching the nozzle will be described.

When the nozzle 44 is attached to the inside of the processing container 11, the lid portion 22 is first completely lowered by the boat elevator 32, and made to swing preferably in the lateral direction to secure a working space below the processing container 11. Next, the bracket 92 is removed from the manifold 18. Then, a tip of the nozzle 44 preliminarily inserted and fixed into the installation portion 84 of the detachable portion 80 is loaded into the supply buffer chamber 14A, and the detachable portion 80 is moved upward in parallel to the manifold 18. When the cut-out portion 82A reaches a position same as the flange plate 74 or a slightly higher than that, the cut-out portion 82A is adapted to contact the flange plate 74 in a manner pressing the detachable portion 80 against the fixing portion 70, and the elbow 82 is placed on the flange plate 74. In other words, the first surface S1 of the flange plate 74 and the first surface S3 of the cut-out portion 82A are made to contact the second surface S2 of the flange plate 74 and the second surface S4 of the cut-out portion 82A respectively. In other words, the first surface S1 and the second surface S2 of the flange plate 74 are made to contact the two side surfaces of the cut-out portion 82A. Consequently, a position of the nozzle 44 is determined inside the processing container 11. When the position of the nozzle 44 is determined, the bolt 64 is attached to fix the detachable portion 80 and the fixing portion 70. After that, the bracket 92 is attached. When the nozzle 44 is inclined in the longitudinal direction, the inclination is adjusted by pushing up the detachable portion 80 by the adjuster 94 from a lower side of the bracket 92.

Next, processing (film forming processing) to form a film on a substrate by using the above-described processing apparatus 2 will be described. Here, described is an example in which a silicon oxide ($SiO_2$) film is formed on a wafer W by supplying, as a raw material gas, a dichlorosilane ($SiH_2Cl_2$: DCS) gas that is a silicon-containing gas and supplying, as a reaction gas, $O_2$ (oxygen) gas that is an oxygen-containing gas. In the following description, note that operation of each of the units constituting the processing apparatus 2 is controlled by the controller 100.

When a plurality of wafers W is charged on the boat 26 (wafer charge), the boat 26 is loaded into the process chamber 14 by the boat elevator 32 (boat load), and the lower end opening portion of the reaction tube 10 is brought into a state hermetically sealed by the lid portion 22.

When the inside of the process chamber 14 is stabilized at a predetermined pressure and a predetermined temperature, a film forming processing is performed.

[Raw Material Gas Supply Process]

First, a DCS gas is supplied to the wafer W inside the process chamber 14.

[Raw Material Gas Exhaust Process]

Next, supply of the DCS gas is stopped, and the inside of the process chamber 14 is evacuated by the vacuum pump 52. At this point, an $N_2$ gas may be supplied as an inert gas into the process chamber 14 from the inert gas supply unit (inert gas purge).

[Reactive Gas Supply Process]

Next, an $O_2$ gas is supplied to the wafer W inside the process chamber 14.

[Reaction Gas Exhaust Process]

Next, supply of the $O_2$ gas is stopped, and the inside of the process chamber 14 is evacuated by the vacuum pump 52. At this point, the $N_2$ gas may be supplied into the process chamber 14 from the inert gas supply unit.

A $SiO_2$ film having a predetermined composition and a predetermined film thickness can be formed on the wafer W by performing a cycle of the above-described four processes predetermined number of times (once or more).

(Boat Unload and Wafer Discharge)

After forming the film having the predetermined film thickness, the $N_2$ gas is supplied from the inert gas supply unit, the inside of the process chamber 14 is replaced with the $N_2$ gas, and the pressure in the process chamber 14 is restored to a normal pressure. After that, the lid portion 22 is lowered by the boat elevator 32, and the boat 26 is unloaded from the reaction tube 10 (boat unload). Then, the processed wafer W is taken out from the boat 26 (wafer discharge).

Exemplary processing conditions at the time of forming the $SiO_2$ film on the wafer W may be as follows.

The film forming processing can be properly advanced by setting each of the processing conditions to a value within each of the following ranges.

Processing temperature (wafer temperature): 300° C. to 700° C.,

Processing pressure (pressure inside process chamber): 1 Pa to 4000 Pa

DCS gas: 100 sccm to 10000 sccm

O$_2$ gas: 100 sccm to 10000 sccm

N$_2$ gas: 100 sccm to 10000 sccm

[Effects of the Present Embodiment]

According to the present embodiment, one or more of following effects can be obtained.

(1) In the related art, since a horizontal portion of a nozzle is fixed to a manifold, the nozzle is detached by detaching the manifold from a processing container downward and then pulling out the horizontal portion from a port at the time of nozzle maintenance. In other words, since disassembly is burdensome and additionally a vacuum seal is to be removed, extra work such as leak check is required after installation. In contrast, in the present disclosure, since the connecting portion of the nozzle has a structure in which the fixing portion is separated from the detachable portion, the nozzle can be pulled out from the nozzle chamber by detaching the detachable portion without pulling out the fixing portion from the port and without detaching the manifold from the processing container. Thus, since there is no need to disassemble a periphery of the lower portion of the processing container, provided are advantages in which not only maintenance time can be shortened but also process reproducibility can be ensured before and after maintenance.

(2) The nozzle can be loaded into the supply buffer chamber while being kept vertical because the detachable portion can be moved from the lower side and installed in the fixing portion. Consequently, since the nozzle is prevented from being obliquely loaded into the supply buffer chamber, the nozzle and the reaction tube can be suppressed from being damaged or broken by the nozzle contacting a side wall of the supply buffer chamber. Additionally, since the nozzle can be loaded vertically into the supply buffer chamber, a volume of the supply buffer chamber can be reduced. Consequently, quality of film formation can be improved because gas controllability can be improved.

(3) Since the detachable portion can be installed by lifting up the detachable portion while gently pressing the detachable portion against the fixing portion, contact with a ceiling of the supply buffer chamber and breakage of the nozzle and the reaction tube caused by such contact can be suppressed. In other word, in the related art, the nozzle is once largely lifted upward and installed, and therefore, there may be a case where a space for maintenance is formed at an upper portion inside the supply buffer chamber so as to prevent the nozzle from contacting the ceiling of the supply buffer chamber. In contrast, according to the present disclosure, since the detachable portion can be moved horizontally and installed without lifting the nozzle largely upward, there is no need to form a space for maintenance at the upper portion of the supply buffer chamber. Therefore, the ceiling of the supply buffer chamber can be lowered, gas can be diffused uniform inside the supply buffer chamber, and uniformity of the film can be improved.

(4) Since the position of the nozzle in the vertical and lateral directions is determined by making the two surfaces of the detachable portion contact the two surfaces of the fixing portion respectively, the nozzle can be easily installed. In other words, the position of the nozzle can be determined by only the two surfaces, other surfaces excluding the two surfaces can be opened, the structure of the fixing portion itself can be made simple and compact, and the fixing portion can be easily gripped and operated.

(5) Since a sealing property can be ensued without using an O-ring by adopting the contact portion between the detachable portion and the fixing portion as a surface sealing, a process range of substrate processing can be broadened. Particularly, in the case of performing depressurizing processing, sealing can be performed more effectively. Since the contact portion between the detachable portion and the fixing portion is located inside the processing container, even when a small amount of leakage occurs from the contact portion, there is no adverse effect given to the outside of the processing container and to the process. Additionally, since there is no need to consider a heat resistant temperature of the O-ring, high-temperature substrate processing can be performed.

The embodiment of the present invention has been specifically described above. However, the present invention is not limited to the above-described embodiment, and various modifications can be made without departing from the gist thereof.

For example, the exemplary case of using the DCS gas as a raw material gas has been described, but besides the DCS gas, a silane raw material gas such as a hexachlorodisilane (Si2Cl6: HCD) gas, a monochlorosilane (SiH3Cl: MCS) gas, or a trichlorosilane (SiHCl3: TCS) gas may also be used. Additionally, an amine-based silane raw material gas such as a trisdimethylaminosilane (Si[N(CH3)2]3H: 3DMAS) gas, a bistertiarybutylaminosilane (SiH2[NH(C4H9)]2: BTBAS) gas, a monosilane (SiH4: MS) gas, or a disilane (Si2H6: DS) gas can also be used.

Furthermore, for example, the exemplary case of forming a SiO$_2$ film has been described in the above-described embodiment. However, the present invention is not limited to this embodiment. For example, a SiN film, a SiON film, a SiOCN film, a SiOC film, a SiCN film, a SiBN film, a SiBCN film, or the like can be formed by using a nitrogen (N)-containing gas (nitride gas) such as ammonia (NH$_3$) gas, a carbon (C)-containing gas such as a propylene (C$_3$H$_6$) gas, a boron (B)-containing gas such as a boron trichloride (BCl$_3$) gas, or the like. In the case of forming these films also, film formation can be performed under processing conditions same as those in the above-described embodiment, and the same effects as the above-described embodiment can be obtained.

Additionally, for example, the present invention is also preferably applicable to a case of forming, on a wafer W, a film containing a metal element such as titanium (Ti), zirconium (Zr), hafnium (Hf), tantalum (Ta), niobium (Nb), aluminum (Al), molybdenum (Mo), tungsten (W), or the like, namely, a metal-based film.

In the above-described embodiment, the example of depositing a film on a wafer W has been described, but the present invention is not limited to this embodiment. For example, the present invention is also preferably applicable to a case of performing, for a wafer W or a film formed on the wafer W, processing such as oxidation processing, diffusion processing, annealing processing, etching processing, or the like.

Additionally, the above-described embodiment and modified example can be suitably used in combination. The processing conditions in this case can be, for example, processing conditions same as those in the above-described embodiment or modified example.

What is claimed is:

1. A substrate processing apparatus, comprising:
    a processing container including a reaction tube and a manifold that supports the reaction tube from below, and configured to process a substrate inside:
    a nozzle configured to supply a processing gas to the substrate; and a connecting portion configured to connect the nozzle inside the processing container, wherein
the connecting portion includes:
a fixing portion including a cylindrical portion inserted into an introduction portion provided at the manifold, and a flange plate formed in a rectangular shape at an end portion of the cylindrical portion; and
a detachable portion, including an elbow configured to engage with the flange plate at a back face of the elbow and an installation portion in which the nozzle is installed, the elbow comprising:
a cut-out portion formed on a lower part of the back face of the elbow, having a predetermined depth and making a surface contact with a front surface of the flange plate;
a hollow space formed inside the elbow such that the upper surface of the elbow communicates with a communication hole on the back face; and
at least two holes formed on the cut-out portion penetrating from the back face to a front face of the elbow, wherein bolts inserted through the at least two holes fix the detachable portion to the fixing portion.

2. The substrate processing apparatus according to claim 1, wherein
the flange plate includes a lateral side surface different from the front surface and a top surface perpendicular to the lateral side surface, and
a position of the nozzle is determined by two surfaces of the cut-out portion contacting the lateral side surface and the top surface, the two surfaces are different from the back face.

3. The substrate processing apparatus according to claim 2, further comprising
the communication hole formed on the back face of the cut-out portion and communicating with the cylindrical portion when the detachable portion is engaged with the flange plate; and
a pedestal portion installed below the detachable portion and provided with an adjuster configured to adjust inclination of the nozzle, the pedestal portion is detachably installed on the manifold.

4. The substrate processing apparatus according to claim 3, wherein the pedestal portion is screwed to the manifold at a position where a lower end of the flange plate contacts the pedestal portion.

5. The substrate processing apparatus according to claim 2, wherein a thickness of the flange plate is larger than a depth of the cut-out portion.

6. The substrate processing apparatus according to claim 5, wherein the cut-out portion are each of a rectangular shape, a top side of the cut-out portion is longer than a top side of the flange plate with which the top side of the cut-out portion contacts, and a lateral side of the flange plate is longer than a lateral side of the cut-out portion with which the lateral side of the flange plate contacts.

7. The substrate processing apparatus according to claim 6, wherein surfaces of the detachable portion and the flange plate are electropolished and smoothly formed so as to have flat surfaces.

8. The substrate processing apparatus according to claim 7, wherein the installation portion includes an inner pipe and an outer pipe and is configured to insert the nozzle into an annular space provided between the inner pipe and the outer pipe.

9. The substrate processing apparatus according to claim 8, wherein a center position of the top side of the cut-out portion is deviated outward from a center position of the inner pipe.

10. The substrate processing apparatus according to claim 2, wherein the installation portion has a double pipe structure including an outer pipe and an inner pipe to which the hollow space is connected, and the nozzle is inserted and fixed in an annular space located between the outer pipe and the inner pipe.

11. A nozzle base to connect a nozzle configured to supply a processing gas to a substrate inside a processing container includes a reaction tube configured to process a substrate and a manifold configured to support the reaction tube from below, the nozzle base comprising:
a fixing portion including a cylindrical portion to be inserted into an introduction portion at the manifold; and a flange plate at an end portion of the cylindrical portion; and
a detachable portion including an elbow configured to engage with the flange plate at a back face of the elbow and an installation portion in which the nozzle is installed, the elbow comprising:
a cut-out portion formed on a lower part of the back face of the elbow, having a predetermined depth and making a surface contact with a front surface of the flange plate;
a hollow space formed inside the elbow such that the upper surface of the elbow communicates with a communication hole on the back face; and
at least two holes formed on the cut-out portion penetrating from the back face to a front face of the elbow, wherein bolts inserted through the at least two holes fix the detachable portion to the fixing portion.

* * * * *